(12) United States Patent
Matsumoto

(10) Patent No.: US 12,512,344 B2
(45) Date of Patent: Dec. 30, 2025

(54) APPARATUS FOR TRANSFERRING MEMBER TO BE DISPOSED IN SUBSTRATE PROCESSING CHAMBER, SUBSTRATE PROCESSING SYSTEM, AND METHOD FOR TRANSFERRING MEMBER

(71) Applicant: TOKYO ELECTRON LIMITED, Tokyo (JP)

(72) Inventor: Wataru Matsumoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 402 days.

(21) Appl. No.: 18/115,238

(22) Filed: Feb. 28, 2023

(65) Prior Publication Data

US 2023/0290656 A1    Sep. 14, 2023

(30) Foreign Application Priority Data

Mar. 8, 2022    (JP)  ................. 2022-035438

(51) Int. Cl.
    *H01L 21/67*      (2006.01)

(52) U.S. Cl.
    CPC .. *H01L 21/67201* (2013.01); *H01L 21/67126* (2013.01); *H01L 21/67167* (2013.01); *H01L 21/6719* (2013.01)

(58) Field of Classification Search
    CPC ......... H01L 21/67742; H01L 21/67196; H01L 21/677; H01L 21/67201; H01L 21/6719
See application file for complete search history.

(56) References Cited

U.S. PATENT DOCUMENTS

| | | | |
|---|---|---|---|
| 11,621,174 B2* | 4/2023 | Sumi | B08B 7/0021 |
| | | | 134/200 |
| 2022/0223447 A1* | 7/2022 | Hatano | H01L 21/6838 |
| 2022/0301921 A1* | 9/2022 | Shindo | H01L 21/67167 |

FOREIGN PATENT DOCUMENTS

| | | | | |
|---|---|---|---|---|
| CN | 116730018 A | * | 9/2023 | ....... H01L 21/67201 |
| JP | 2018207076 A | * | 12/2018 | |
| JP | 2021141305 A | | 9/2021 | |
| JP | 2023543061 A | * | 10/2023 | ....... H01L 21/67709 |
| KR | 20220041022 A | * | 3/2022 | ....... H01L 21/67109 |
| WO | WO-2022158351 A1 | * | 7/2022 | ....... H01L 21/67709 |

\* cited by examiner

*Primary Examiner* — Kaitlin S Joerger
(74) *Attorney, Agent, or Firm* — Fenwick & West LLP

(57) ABSTRACT

There is an apparatus for transferring a member to be disposed in a substrate processing chamber between a substrate transfer chamber and the substrate processing chamber adjacent to each other, comprising: a valve body that is attached to and detached from an opening through which the substrate transfer chamber and the substrate processing chamber communicate and is configured to close the opening; a member holding part extending from the valve body into the substrate processing chamber when the opening is closed by the valve body, and configured to transfer the member to a preset arrangement position in the substrate processing chamber; and a moving mechanism configured to move the valve body separated from the opening in the substrate transfer chamber.

6 Claims, 9 Drawing Sheets

APPARATUS FOR TRANSFERRING MEMBER TO BE DISPOSED IN SUBSTRATE PROCESSING CHAMBER, SUBSTRATE PROCESSING SYSTEM, AND METHOD FOR TRANSFERRING MEMBER

CROSS-REFERENCE TO RELATED APPLICATIONS

This application claims priority to Japanese Patent Application No. 2022-035438 filed on Mar. 8, 2022, the entire contents of which are incorporated herein by reference.

TECHNICAL FIELD

The present disclosure relates to an apparatus for transferring a member to be disposed in a substrate processing chamber, a substrate processing system, and a method for transferring the member.

BACKGROUND

In an apparatus for processing a semiconductor wafer (hereinafter, also referred to as "wafer") as a substrate, the wafer is transferred by a transfer mechanism to a processing chamber for processing a wafer and is processed in the processing chamber. Various members corresponding to wafer processing are disposed in the processing chamber, and subjected to maintenance or cleaning periodically.

For example, Japanese Laid-open Patent Publication No. 2021-141305 discloses a technique that allows a supporting part of a wafer transfer device to transfer an edge ring or a cover ring in a plasma processing apparatus which includes a substrate supporting surface on which a substrate is placed, the edge ring, and the cover ring. The edge ring surrounds the substrate held on the substrate supporting surface, and the cover ring is disposed to cover the outer surface of the edge ring.

SUMMARY

The present disclosure provides a technique for transferring a member to be disposed in a preset position in a substrate processing chamber between a substrate transfer chamber and the substrate processing chamber adjacent to each other.

In accordance with an aspect of the present disclosure, there is an apparatus for transferring a member to be disposed in a substrate processing chamber between a substrate transfer chamber and the substrate processing chamber adjacent to each other, comprising: a valve body that is attached to and detached from an opening through which the substrate transfer chamber and the substrate processing chamber communicate and is configured to close the opening; a member holding part extending from the valve body into the substrate processing chamber when the opening is closed by the valve body, and configured to transfer the member to a preset arrangement position in the substrate processing chamber; and a moving mechanism configured to move the valve body separated from the opening in the substrate transfer chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

<Substrate Processing System>

Hereinafter, a configuration of an apparatus for transferring a member to be disposed in a substrate processing chamber according to an embodiment of the present disclosure will be described with reference to FIG. 1. A substrate processing system 1 includes the apparatus for transferring the member.

Figure 1:
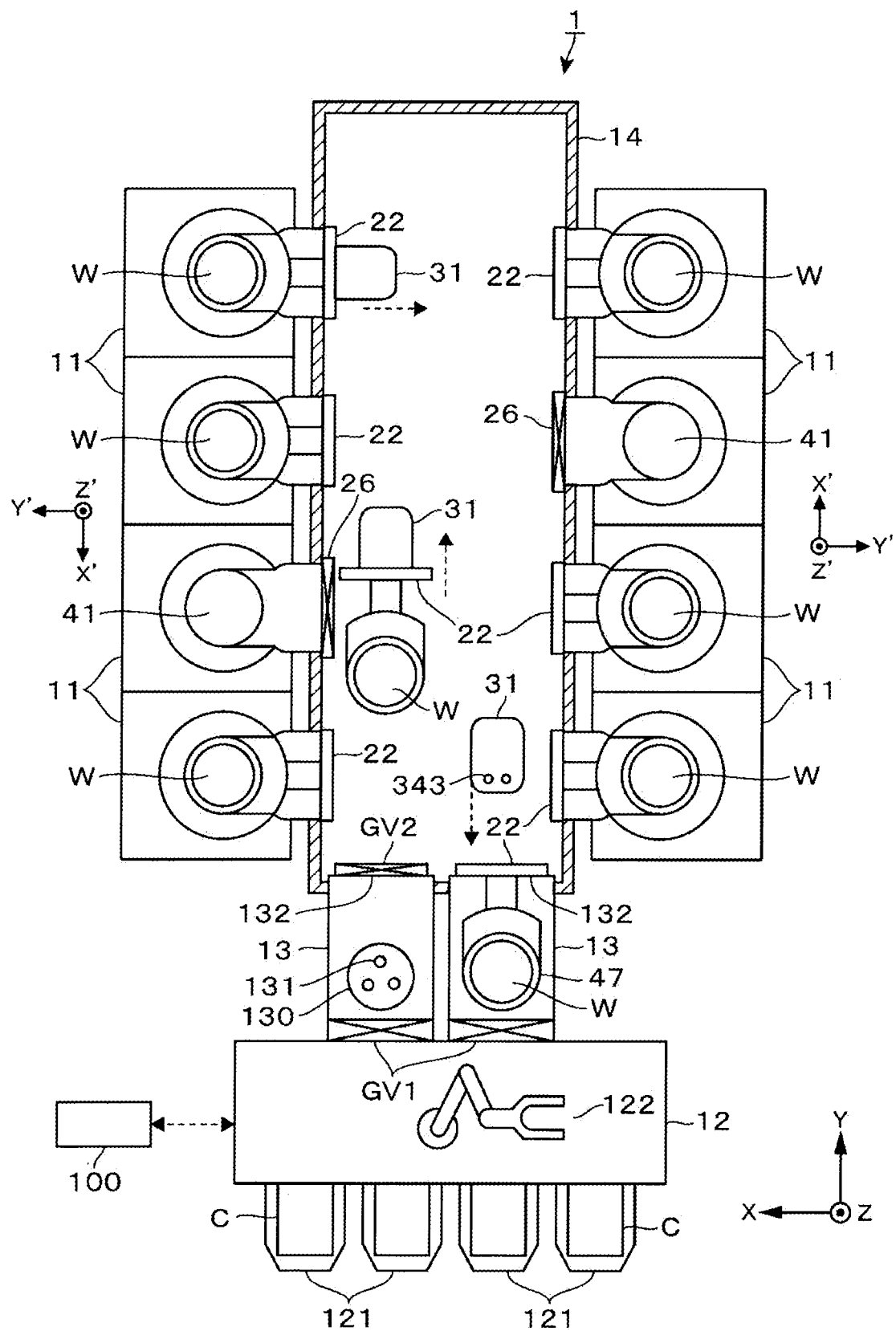
FIG. 1 is a plan view showing a configuration example of a substrate processing system.

FIG. 1 shows a multi-chamber type substrate processing system 1 including a plurality of substrate processing chambers 11 for processing wafers W. As shown in FIG. 1, the substrate processing system 1 includes an atmospheric transfer chamber 12, load-lock chambers 13, a substrate transfer chamber 14, and a plurality of substrate processing chambers 11, which are arranged horizontally from the atmospheric transfer chamber 12 side in that order. In the substrate processing system 1, the installation position of the atmospheric transfer chamber 12 is set to a front side, and a forward-backward direction and a left-right direction viewed from the front side is set to the Y direction and the X direction, respectively.

Load ports 121 are arranged on the front side of the atmospheric transfer chamber 12. For example, four load ports 121 configured as placing tables on which carriers C accommodating wafers W to be processed are placed are arranged side by side in the horizontal direction. A front opening unified pod (FOUP) or the like can be used as the carrier C, for example.

The atmospheric transfer chamber 12 has an atmospheric pressure (normal pressure) atmosphere. For example, downflow of clean air is formed in the atmospheric transfer chamber 12. Further, an atmospheric transfer mechanism 122 configured as a multi-joint arm, for example, is disposed in the atmospheric transfer chamber 12 to transfer the wafer W between the carriers C and the load-lock chambers 13.

Two load-lock chambers 13, for example, are arranged side by side between the atmospheric transfer chamber 12 and the substrate transfer chamber 14. The inner atmosphere of the load-lock chamber 13 is switchable between an atmospheric pressure atmosphere and a vacuum atmosphere. Each of the load-lock chamber 13 has a transfer stage 130 on which a wafer W is placed and lift pins 131 for lifting and holding a wafer W. For example, three lift pins 131 are arranged at equal intervals along the circumferential direction and configured to be raised and lowered.

Openings through which a wafer W is transferred are disposed between the load-lock chambers 13 and the atmospheric transfer chamber 12, and between the load-lock chamber 13 and the substrate transfer chamber 14. The openings can be opened and closed by gate valves GV1 and GV2. As will be described later, openings 132 disposed between the load-lock chambers 13 and the substrate transfer chamber 14 can be opened and closed by a valve body 22, as in the substrate processing chamber 11.

As shown in FIG. 1, the substrate transfer chamber 14 is configured as a housing elongated in the forward-backward direction and having a rectangular shape in plan view, and is evacuated to a vacuum atmosphere by a vacuum evacuation mechanism (not shown). Further, an inert gas supply part (not shown) for supplying an inert gas (for example, nitrogen gas) may be connected to the substrate transfer chamber 14 to constantly supply the inert gas into the substrate transfer chamber 14 that has been depressurized.

In the substrate processing system 1 of the example shown in FIG. 1, four substrate processing chambers 11 are arranged on the left sidewall of the substrate transfer chamber 14, and other four substrate processing chambers 11 are arranged on the right sidewall of the substrate transfer chamber 14. Each substrate processing chamber 11 is configured to perform vacuum processing on a wafer W. The processing performed on the wafer W may include etching, film formation, cleaning, ashing, or the like.

First Embodiment

Figure 2:
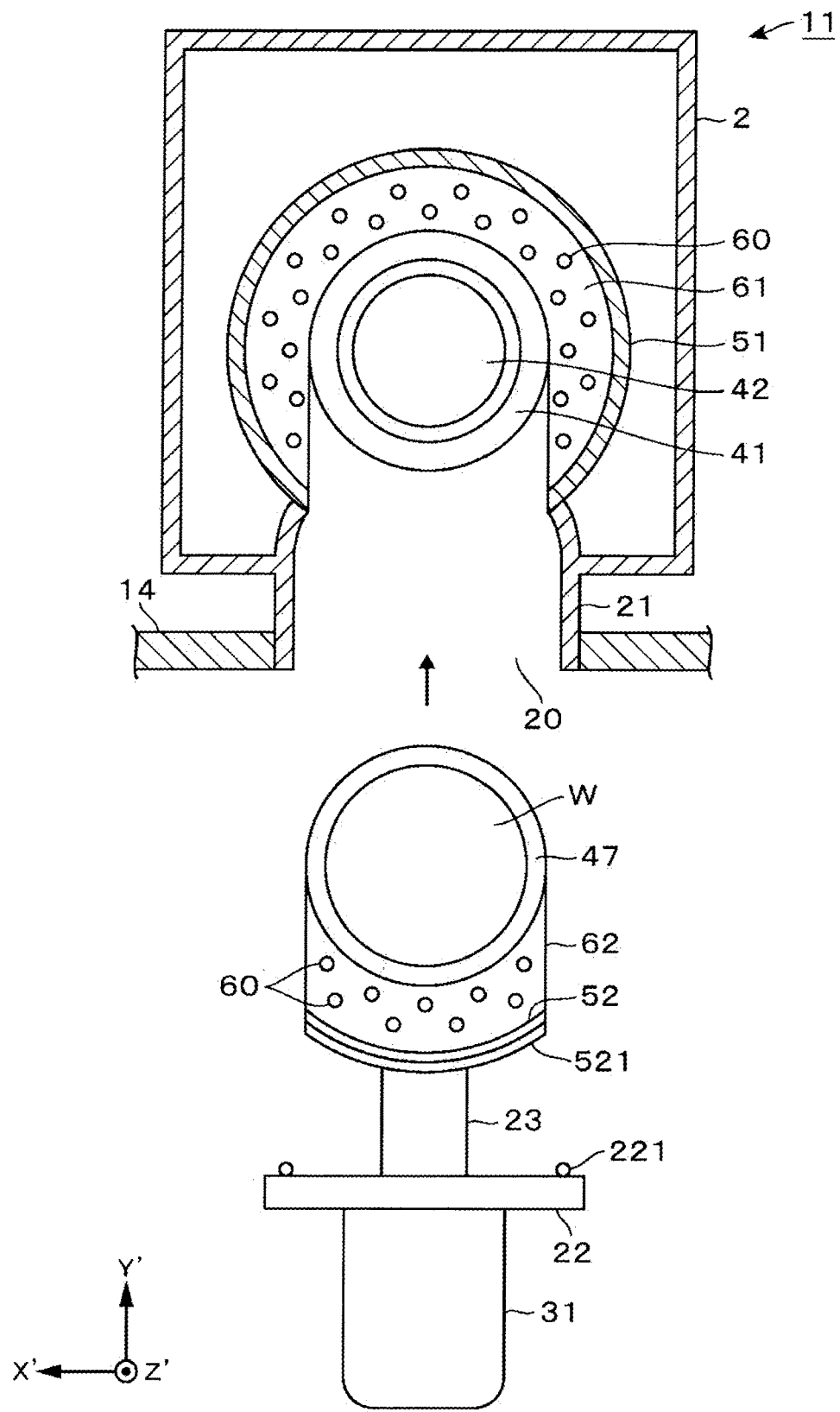
FIG. 2 is a plan view showing a substrate processing chamber according to a first embodiment.

The present disclosure relates to an apparatus for transferring a member, to be disposed in a substrate processing chamber 11, between the substrate processing chamber 11 and a substrate transfer chamber 14 adjacent to each other. Hereinafter, the substrate processing chamber 11 and the substrate transfer chamber 14 according to a first embodiment will be described. FIGS. 1 and 2 also show secondary coordinate axes in which the arrangement direction of the substrate transfer chamber 14 viewed from the substrate processing chambers 11 is set on the base end side of the Y'-axis. In the description of each substrate processing chamber 11, the connection position between the substrate processing chamber 11 and the substrate transfer chamber 14 is set to the front side (forward side).

Figure 3:
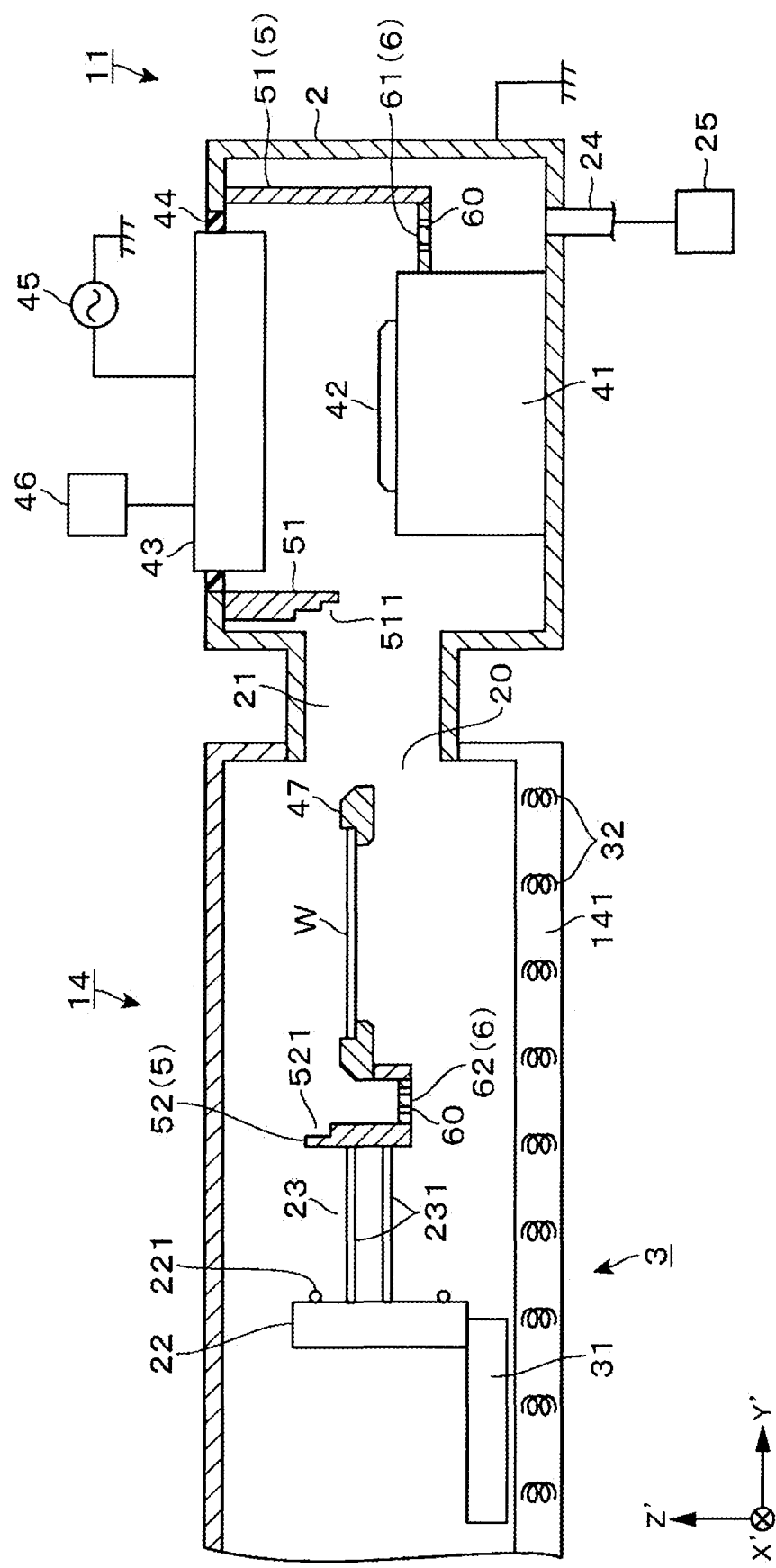
FIG. 3 is a longitudinal side view showing the substrate transfer chamber and a substrate processing chamber according to the first embodiment.
Figure 4:
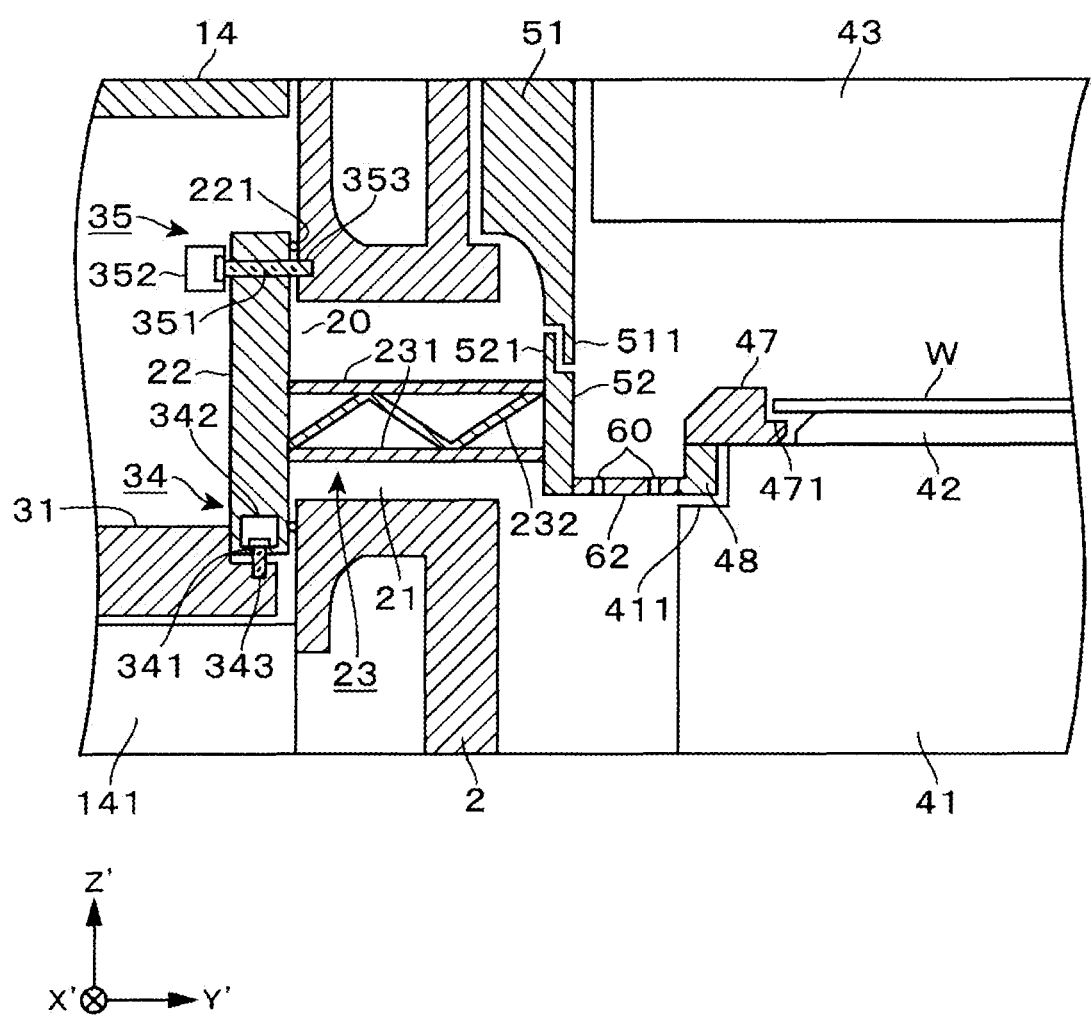
FIG. 4 is a longitudinal cross-sectional view showing an enlarged part of the first embodiment.

As shown in FIGS. 2 to 4, the substrate processing chamber 11 of this example includes a processing chamber 2, and a communication path 21 that connects the processing chamber 2 and the substrate transfer chamber 14. The wafer W is transferred between the processing chamber 2 and the substrate transfer chamber 14 through the communication path 21.

The communication path 21 is configured as, for example, a transfer path having a vertical dimension smaller than that of the processing chamber 2 or the substrate transfer chamber 14 and having a width dimension that allows members including the wafer W to pass therethrough. The substrate transfer chamber 14 communicates with the substrate processing chamber 11 through an opening 20 formed at one end of the communication path 21.

The opening 20 is configured to be opened and closed by the valve body (first valve body) 22. The valve body 22 can be attached to and detached from the opening 20, and can move in the substrate transfer chamber 14 while being connected to a moving mechanism 3 to be described later.

The valve body 22 includes a member holding part 23 for transferring a member into the substrate processing chamber 11. The member holding part 23 is inserted into the substrate processing chamber 11 when the opening 20 is closed by the valve body 22, and can transfer a member to be transferred to a preset arrangement position in the substrate processing chamber 11. Further, the valve body 22 has an O-ring 221 for hermetically closing the opening 20. Moreover, the opening 20 is configured to be opened and closed also by a second valve body 26. The second valve body 26 closes the opening 20 while the first valve body is separated. The configuration of the second valve body 26 will be described later (see FIG. 7).

The members transferred by the member holding part 23 and arranged in the substrate processing chamber 11 will be described in detail later. In this example, such members may be "wafer," "focus ring," "a part of a shield member," and "a part of a flow rectifying member". Hereinafter, these members are also referred to as "arrangement members".

Further, the preset arrangement position in the substrate processing chamber 11 indicates the position where the member is disposed when the wafer W is processed in the substrate processing chamber 11. Hereinafter, "preset arrangement position" may also be referred to as "member arrangement position".

Next, the configuration example of the substrate processing chamber 11 in the case of performing plasma etching on a wafer W will be described. The processing chamber 2 in the substrate processing chamber 11 is grounded and connected to a vacuum exhaust mechanism 25 through an exhaust line 24. A substrate support 41 is disposed in the processing chamber 2, and the substrate support 41 in this example has a convex portion 42 on the upper surface thereof. For example, the convex portion 42 has a trapezoidal longitudinal cross-sectional shape, and the upper surface thereof serves as a substrate supporting surface for supporting the wafer W from the backside thereof. The peripheral portion of the substrate supporting surface is located inner than the outer edge of the wafer W. The wafer W is subjected to predetermined vacuum processing while being placed on the substrate supporting surface (upper surface of the convex portion 42). Hereinafter, the wafer W placed on the substrate supporting surface may also be referred to as "wafer W placed on the substrate support 41". In addition, a heater (not shown) is embedded in the substrate support 41.

A shower head 43 is disposed at the ceiling portion of the processing chamber 2 to face the wafer W placed on the substrate support 41 via an insulating member 44. A radio frequency (RF) power supply 45 for plasma generation is connected to the shower head 43, and the shower head 43 is configured to function as an upper electrode. On the other hand, the substrate support 41 is grounded through the processing chamber 2, and functions as a lower electrode. The shower head 43 and the substrate support 41 constitute a parallel plate type plasma generating mechanism. In the substrate processing chamber 11 in which processing using no plasma is performed, the plasma generating mechanism such as the RF power supply 45 or the like may not be provided.

The shower head 43 has a plurality of gas injection holes (not shown) on the bottom surface thereof, and is configured to supply an etching gas from an etching gas (processing gas) supply source 46 into the processing chamber 2 through the shower head 43.

When the etching gas is supplied from the shower head 43 and the RF power is applied from the RF power supply 45 to the shower head 43, capacitively coupled plasma is generated between the shower head 43 and the substrate support 41.

A shield member 5 is disposed in the processing chamber 2. The shield member 5 prevents by-products generated by the processing of the wafer W from being adhered to the inner wall of the processing chamber 2 that is the main body of the substrate processing chamber 11. In this example, the shield member 5 is provided to prevent by-products generated during an etching process from being adhered to the processing chamber 2. The shield member 5 is formed by assembling a first shield member 51 attached to the processing chamber 2 and a second shield member 52 that is an arrangement member loaded by the member holding part 23.

As described above, the valve body 22 can move in the substrate transfer chamber 14 by the moving mechanism 3. Therefore, the arrangement members including the second shield member 52 described above are configured to move in the substrate transfer chamber 14 together with the valve body 22.

FIGS. 2 and 3 show a state in which the arrangement member is positioned in the substrate transfer chamber 14. FIG. 4 also shows a state in which the opening 20 is closed by the valve body (the first valve body) 22 and the arrangement members are disposed at the member arrangement positions in the processing chamber 2. In FIGS. 2 to 4, the illustration of the second valve body 26 is omitted.

In this example, the shield member 5 is formed in a substantially cylindrical shape, and is disposed to surround the sidewall of the shower head 43 or the upper portion of the sidewall of the substrate support 41 with a gap interposed therebetween.

The second shield member 52 is formed by cutting out the sidewall portion of the cylindrical shield member 5 facing the opening of the communication path 21 on the cylindrical shield member 5 side. The remaining part of the shield member 5 constitutes the first shield member 51. Hereinafter, the area of the first shield member 51 where the second shield member 52 is cut out is referred to as "notch area".

At the position where the second shield member 52 is cut out, the lower end of the first shield member 51 is positioned at a height at which it does not interfere with the loading/unloading path of the wafer W that is loaded/unloaded while being held by the member holding part 23. As shown in FIGS. 3 and 4, a stepped portion 511 is formed at the lower end of the first shield member 51 to be engaged with the upper end of the second shield member 52.

A flow rectifying member 6 is disposed around the substrate support 41. The flow rectifying member 6 is used for rectifying air flow in the processing chamber 2, and is configured as an annular plate member having a plurality of holes 60, for example. In the examples shown in FIGS. 2 to 4, the flow rectifying member 6 is fitted into the area between the sidewall of the substrate support 41 and the shield member 5, and is disposed to face the floor of the processing chamber 2. A second flow rectifying member 62 is formed by cutting out the area between the second shield member 52 and the sidewall of the substrate support 41 in plan view of the flow rectifying member 6 having an annular shape. The remaining part of the flow rectifying member 6 constitutes a first flow rectifying member 61. Also in the first flow rectifying member 61, the area where the second flow rectifying member 62 is cut out is referred to as "notch area".

<Members Arranged in Substrate Processing Chamber>

Next, members (arrangement members) arranged in the substrate processing chamber 11 will be described. The arrangement members in this example include the wafer W to be processed in the substrate processing chamber 11 and the focus ring 47, in addition to the second shield member 52 and the second flow rectifying member 62 described above.

The arrangement members are held by the member holding part 23 connected to the valve body 22. As shown in FIG. 4, the member holding part 23 is disposed to extend from the valve body 22 toward the substrate processing chamber 11 when the opening 20 is closed by the valve body 22.

As shown in FIGS. 2 to 4, the member holding part 23 is attached to the front surface of the valve body 22 to extend substantially horizontally. In this example, the member holding part 23 includes plate-shaped members 231 arranged in parallel horizontally. As shown in FIG. 4, a truss member 232 for increasing strength is disposed between the plate-shaped members 231.

The tip end of the member holding part 23 is connected to the rear surface of the second shield member 52. The second shield member 52 whose rear surface is held by the member holding part 23 is fitted to the notch area of the first shield member 51 attached to the processing chamber 2 side when the second shield member 52 is transferred to the member arrangement position shown in FIG. 4. The first shield member 51 and the second shield member 52 constitute the shield member 5. A stepped portion 521 is formed at the upper end of the second shield member 52 to be assembled with the stepped portion 511 on the first shield member 51 side.

The second flow rectifying member 62 is connected to the lower end of the front surface of the second shield member 52. The second flow rectifying member 62 is fitted to the notch area of the first flow rectifying member 61 attached to the processing chamber 2 side when the second flow rectifying member 62 is transferred to the member arrangement position shown in FIG. 4. The first flow rectifying member 61 and the second flow rectifying member 62 constitute the annular flow rectifying member 6.

Further, the focus ring 47 is connected to the tip end side of the second flow rectifying member 62. The focus ring 47 is disposed around the wafer W to improve the in-plane uniformity of plasma etching to be performed on the wafer W.

As shown in FIG. 2, the focus ring 47 is an annular member, and is disposed around the convex portion 42 of the substrate support 41 when the focus ring 47 is transferred to the member arrangement position shown in FIG. 4. Further, the focus ring 47 has a stepped portion 471 for holding the peripheral portion of the wafer W. The focus ring 47 is inserted into the substrate processing chamber 11 while holding the wafer W on the stepped portion 471.

For example, in a state where the focus ring 47 is disposed at the member arrangement position, the height position of the upper surface of the stepped portion 471 is set to be lower than the height position of the upper surface (substrate supporting surface) of the convex portion 42. With this configuration, when the focus ring 47 holding the wafer W is lowered, the wafer W is transferred onto the convex portion 42. During the processing of the wafer W, the stepped portion 471 is retracted to a position lower than the wafer W.

In the drawings except FIG. 4, for convenience of illustration, the height position of the convex portion 42 and that of the step portion 471 of the focus ring 47 are aligned. The height position of the convex portion 42 and that of the stepped portion 471 may be aligned. Alternatively, the upper surface of the stepped portion 471 may be higher than the upper surface of the convex portion 42, and the processing may be performed in a state where the wafer W is held by the focus ring 47.

As shown in FIG. 4, a support member 48 for supporting the focus ring 47 from the bottom surface thereof is disposed at the tip end of the second flow rectifying member 62. On the other hand, the substrate support 41 has a stepped portion 411 for avoiding interference with the support member 48 when the second flow rectifying member 62 and the focus ring 47 are arranged at the member arrangement positions. The illustration of the stepped portion 411 of the substrate support 41 is omitted in the drawings except FIG. 4.

<Moving Mechanism>

In the substrate transfer chamber 14 described above, the members (the wafer W, the second shield member 52, the second flow rectifying member 62, and the focus ring 47) arranged at the member arrangement positions are transferred by moving the valve body 22 using the magnetic levitation type moving mechanism 3. For example, as shown in FIGS. 3 and 5, the moving mechanism 3 includes a floor 141 of the substrate transfer chamber 14 that is provided with a first magnet, and a moving body 31 configured to be movable in the substrate transfer chamber 14.

The moving body 31 is formed in a rectangular shape in plan view, is provided with a second magnet having a repulsive force against the first magnet. The moving body 31 is configured to be movable by magnetic levitation using the repulsive force.

Figure 5:
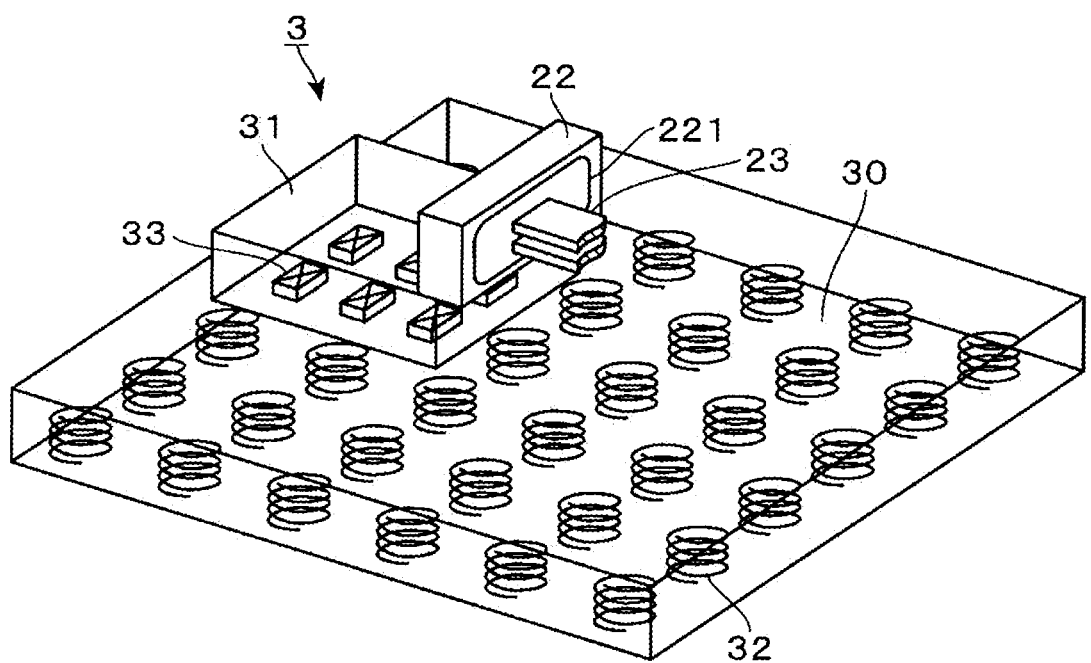
FIG. 5 is a perspective view showing a configuration example of a moving mechanism according to the first embodiment.

As schematically shown in FIG. 5, a plurality of tiles (moving tiles) 30 are disposed on the floor 141 of the substrate transfer chamber 14. The tiles 30 are arranged in the movement area of the moving body 31 that extends from the position where the wafer W is transferred to and from to the load-lock chamber 13 to the front side of the substrate processing chamber 11.

A plurality of moving surface-side coils 32 are arranged in each tile 30. The moving surface-side coils 32 correspond to the first magnets of the present disclosure, and generate a magnetic field when a power is supplied from a power supply part (not shown).

On the other hand, a plurality of module-side magnets 33 that are permanent magnets, for example, are arranged in the moving body 31. The module-side magnets 33 correspond to the second magnets of the present disclosure, and a repulsive force (magnetic force) acts against the module-side magnets 33 by the magnetic field generated by the moving surface-side coils 31. Accordingly, the moving body 31 can be magnetically levitated with respect to the moving surface on the upper surface side of the tile 30. The module-side magnets 33 may include coils that receive a power from a battery disposed in the moving body 31 and function as electromagnets. Further, the module-side magnets 33 may include both a permanent magnet and a coil.

The tile 30 can change the magnetic field state by adjusting the position where the magnetic field is generated or the strength of the magnetic force using the moving surface-side coils 32. By controlling the magnetic field, it is possible to move the moving body 31 in a desired direction on the moving surface, adjust the levitation distance from the moving surface, and adjust the direction of the moving body 31. The magnetic field on the tile 30 side is controlled by selecting the moving surface-side coils 32 to which the power is supplied or by adjusting the magnitude of the power supplied to the moving surface-side coils 32.

As shown in FIGS. 3 and 4, the lower end of the valve body 22 is attached to the upper surface on the tip end side of the moving body 31. In this example, as shown in FIG. 4, the valve body 22 and the moving body 31 are configured to be attached to and detached from by a first screw mechanism 34. For example, the valve body 22 includes a screw 341 that can protrude downward from the bottom surface of the valve body 22 and a driving mechanism 342 for the screw 341. On the other hand, a screw hole 343 into which the screw 341 is screwed is formed in the upper surface of the moving body 31. Therefore, by rotating the screw 341 to be tightened by the driving mechanism 342, the screw 341 is inserted into the screw hole 34, and the valve body 22 is fixed to the moving body 31. On the other hand, by rotating the screw 341 to be loosened and lifting the lower end of the screw 341 from the upper surface of the moving body 31, the valve body 22 is separated from the moving body 31.

Further, the valve body 22 can be attached to and detached from the wall around the opening 20 of the processing chamber 2 by a second screw mechanism 35, for example. For example, the valve body 22 includes a mounting screw 351 that can protrude forward from the front surface of the valve body 22, and a driving mechanism 352 for the screw 351. On the other hand, a screw hole 353 into which the screw 351 is screwed is formed in the wall of the processing chamber 2 to which the valve body 22 is attached. By rotating the screw 351 to be tightened by the driving mechanism 352, the valve body 22 is fixed to the wall of the processing chamber 2. By rotating the screw 351 to be loosened and separating the screw 351 from the wall, the valve body 22 is separated from the processing chamber 2.

The mechanism for attaching/detaching the valve body 22 and the moving body 31 or the wall of the processing chamber 2 is not limited to the screw mechanism as long as it is a mechanism for mechanically attaching/detaching them. The moving body 31 may grip the valve body 22 using a manipulator provided on the wall side of the processing chamber 2.

The member transfer device of the present disclosure is disposed such that the member holding part 23 extends from the opening 20 toward the substrate processing chamber 11 when the opening 20 is closed by the valve body 22. The members held by the member holding part 23, in this example, the second shield member 52, the second flow rectifying member 62, the focus ring 47, and the wafer W are transferred to preset arrangement positions in the substrate processing chamber 11. The member holding part 23 has a function of transferring the wafer W to a position in the substrate processing chamber 11 where processing is performed, and thus corresponds to the substrate holding part of the present disclosure.

Next, the configuration of the load-lock chamber 13 in the example shown in FIG. 1 will be further described. As described above, the opening 132 for transferring the wafer W, which is formed between the load-lock chamber 13 and the substrate transfer chamber 14, can be opened and closed by any one of the gate valve GV2 and the valve body 22. Further, the transfer stage 130 on which the wafer W is placed has a convex portion having the same shape as that of the substrate support 41, for example.

When the opening 132 of the load-lock chamber 13 is closed by the valve body 22, the member holding part 23 is disposed to extend from the valve body 22 toward the stage 130. With this configuration, the wafer W can be transferred from the focus ring 47 to the stage 130 in the same manner as the transfer operation of the wafer W between the substrate support 41 on the substrate processing chamber 11 side and the focus ring 47 described with reference to FIG. 4, for example.

The stage 130 may not be provided in the load-lock chamber 13, and the focus ring 47 may enter the load-lock chamber 13 and stand by at a preset height position. In this case, the wafer W can be transferred to and from the atmospheric transfer mechanism 122 by allowing the lift pins 131 to protrude to positions higher than the height at which the wafer W is held by the focus ring 47.

Further, a screw hole (not shown) into which the valve body 22 is screw-fixed by the above-described second screw mechanism 35 is formed in the wall of the load-lock chamber 13 around the opening 132. The gate valve GV2 is configured to retract to a position where the opening/closing operation of the opening 132 by the valve body 22 is not interfered (see also FIG. 7 to be described later).

In the example shown in FIG. 1, the length in the short side direction of the substrate transfer chamber 14 having a rectangular shape in plan view allows two moving bodies 31 arranged side by side, each holding the valve body 22, to move without interference. In this example, the valve body 22 and the members are transferred using a plurality of moving bodies 31 disposed in the substrate transfer chamber 14.

The device including the valve body 22, the member holding part 23 for holding a member, and the moving mechanism 3 that are described above corresponds to the device for transferring a member to be disposed in the substrate processing chamber 11 of the present disclosure.

<Controller>

The substrate processing system 1 includes a controller 100. The controller 100 is a computer having a CPU and a storage device, and controls individual components of the substrate processing system 1. The storage device stores a program including a group of steps (commands) for controlling the movement of the moving body 31 and the operation of the substrate processing chamber 11. The program is stored in a storage medium such as a hard disk, a compact disk, a magneto-optical disk, a memory card, a non-volatile memory, or the like, and installed in the computer.

<Transfer Operation>

Next, an example of an operation of transferring the wafer W in the substrate processing system 1 configured as described above will be described. First, when the carrier C accommodating wafers W to be processed is placed on the load port 121, a wafer W is taken out from the carrier C by the atmospheric transfer mechanism 122 in the atmospheric transfer chamber 12.

On the other hand, in the load-lock chamber 13, as shown in FIG. 1, before the wafer W is transferred, the opening 132 is closed by the valve body 22, and the member holding part 23 enters the load-lock chamber 13 to place the focus ring 47 on the stage 130.

Then, the wafer W is loaded into the load-lock chamber 13 by the atmospheric transfer mechanism 122, and is received by the lift pins 131. Next, the lift pins 131 are lowered to transfer the wafer W to the stage 130.

Thereafter, when the atmospheric transfer mechanism 122 retracts from the load-lock chamber 13, the gate valve GV1 is closed to switch the inner atmosphere of the load-lock chamber 13 from an atmospheric pressure atmosphere to a vacuum atmosphere.

In the load-lock chamber 13 on the right side of FIG. 1, the pressure in the load-lock chamber 13 is adjusted in a state where the wafer W is placed on the stage 130. In this example, the valve body 22 that closes the opening 132 is separated from the moving body 31. When the inner atmosphere of the load-lock chamber 13 is switched to a vacuum atmosphere, the moving body 31 is attached to the valve body 22. The attachment and detachment of the moving body 31 and the valve body 22 will be described later. Further, the connection of the valve body 22 to the wall around the opening 132 by the second screw mechanism 35 is released. Next, in the substrate transfer chamber 14, the moving body 31 is raised by magnetic levitation using the magnetic field generated by the moving surface-side coils 32 disposed in the tiles 30.

Then, the moving body 31 retracts to remove the valve body 22 from the opening 132. At this time, the focus ring 47 is raised by raising the moving body 31, and the wafer W is transferred to the focus ring 47. Next, the moving body 31 retracts to the substrate processing chamber 11 where the wafer W is processed, and rotates such that the front end of the member holding part 23 holding the wafer W faces the opening 20. Next, the movement direction of the moving body 31 is switched to a forward direction in order to load the wafer W into the substrate processing chamber 11.

Figure 6A:
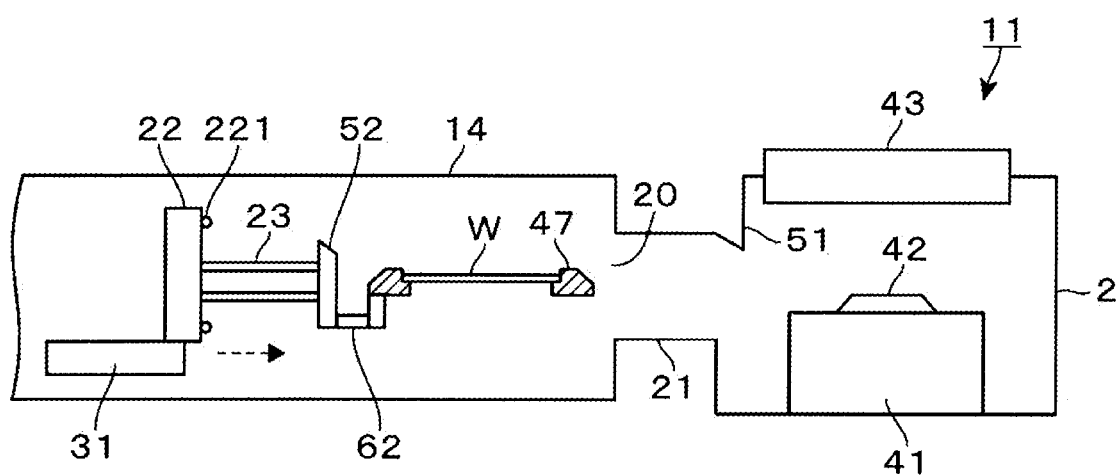
FIG. 6A is a first longitudinal cross-sectional view showing an action of the first embodiment.
Figure 6B:
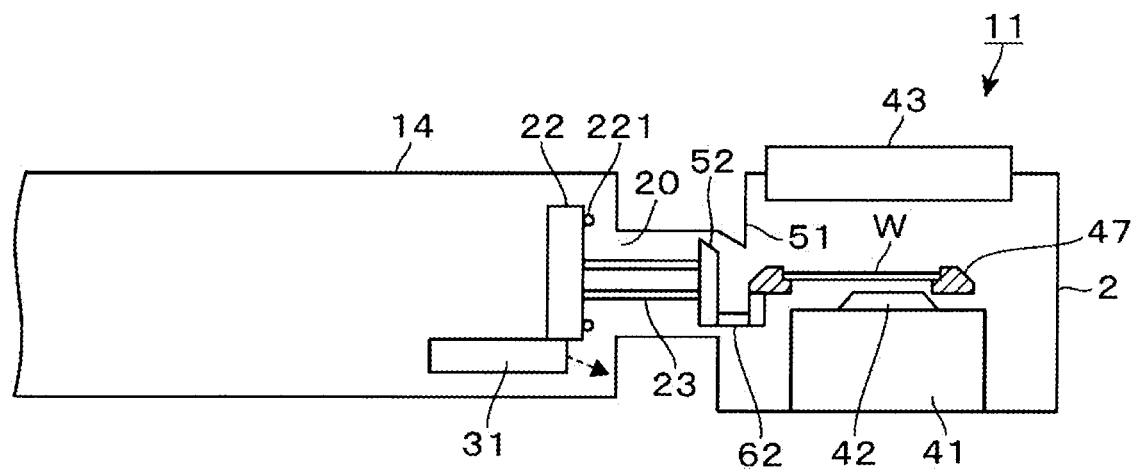
FIG. 6B is a second longitudinal cross-sectional view showing an action of the first embodiment.
Figure 6C:
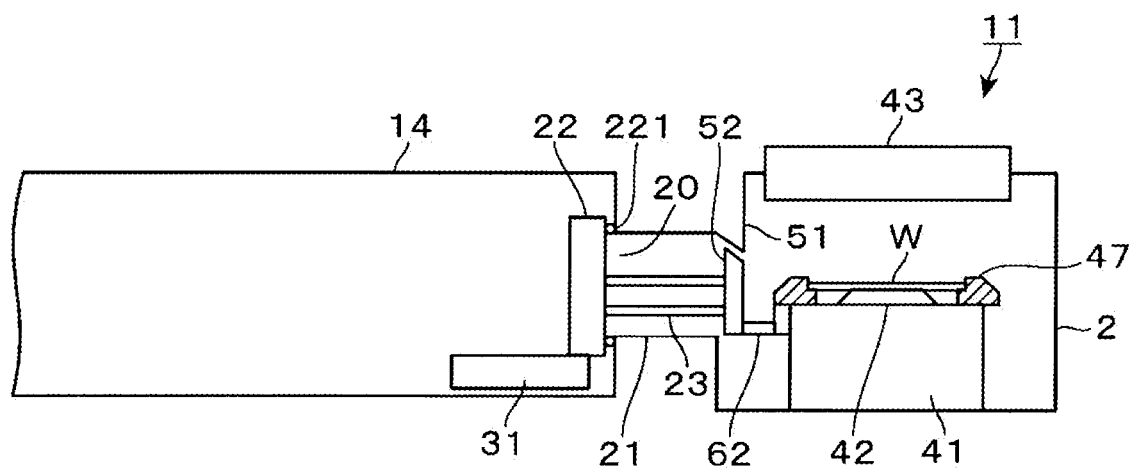
FIG. 6C is a third longitudinal cross-sectional view showing an action of the first embodiment.

Accordingly, the member holding part 23 holding the wafer W faces the opening 20 of the substrate processing chamber 11 as shown in FIG. 6A. Then, as shown in FIG. 6B, the moving body 31 is moved forward to a position where the center of the wafer W is located slightly in front of the center of the substrate support 41 above the substrate support 41. In FIGS. 6A to 6D and 7, the first shield member 51 disposed near the opening of the communication path 21 on the substrate processing chamber 11 side, and the second shield member 52 are illustrated in a simplified manner. Further, the illustration of the first shield member 51 and the first flow rectifying member 61 in other areas is omitted.

Next, the moving body 31 is lowered while moving straight and the wafer W is moved obliquely downward. Accordingly, first, the wafer W is brought into contact with the upper surface of the convex portion 42 of the substrate support 41. Further, by continuing the above-described moving operation of the moving body 31, the wafer W is transferred from the focus ring 47 to the convex portion 42 (see FIG. 6C). Next, the moving body 31 is lowered to the member arrangement position where the focus ring 47 is brought into contact with the substrate support 41. As described above, for convenience of illustration, in FIG. 6C, the height position of the stepped portion 471 and that of the convex portion 42 of the focus ring 47 are aligned.

The length dimension of the member holding part 23 is adjusted such that the opening 20 is closed by the valve body 22 when the focus ring 47 is brought into contact with the substrate support 41. Further, by performing the above-described loading operation of the wafer W, the members (the focus ring 47, the second shield member 52, and the second flow rectifying member 62) held by the member holding part 23 are transferred to the respective member arrangement positions.

As described above, in order to place the wafer W on the substrate support 41, the moving body 31 is moved obliquely downward. The shape of the communication path 21 or the first shield member 51 is set and the height position of the moving body 31 in the substrate transfer chamber 14 is controlled such that such a moving operation can be performed.

In this example, the wafer W is moved obliquely downward to be transferred from the focus ring 47 to the substrate support 41. In this transfer operation, the focus ring 47 continues to move obliquely downward even after the wafer W is transferred to the substrate support 41. Therefore, the center of the wafer W placed on the substrate support 41 and the center of the focus ring 47 may be slightly misaligned. In this case, the misalignment direction and the misalignment amount between two centers are obtained in advance. Then, the wafer W that has been misaligned by the misalignment amount in advance may be transferred to the focus ring 47 in a direction opposite to the misalignment direction in the load-lock chamber 13.

The above-described transfer operation of moving the wafer W obliquely downward is an example, and the wafer W may be transferred along another transfer path. For example, the moving body 31 moves straight to transfer the wafer W to a position above the substrate support 41 such that both centers are aligned. Next, the moving body 31 may be lowered to transfer the wafer W to the convex portion 42, and the moving body 31 may be lowered to locate the focus ring 47 at the member arrangement position.

Figure 6D:
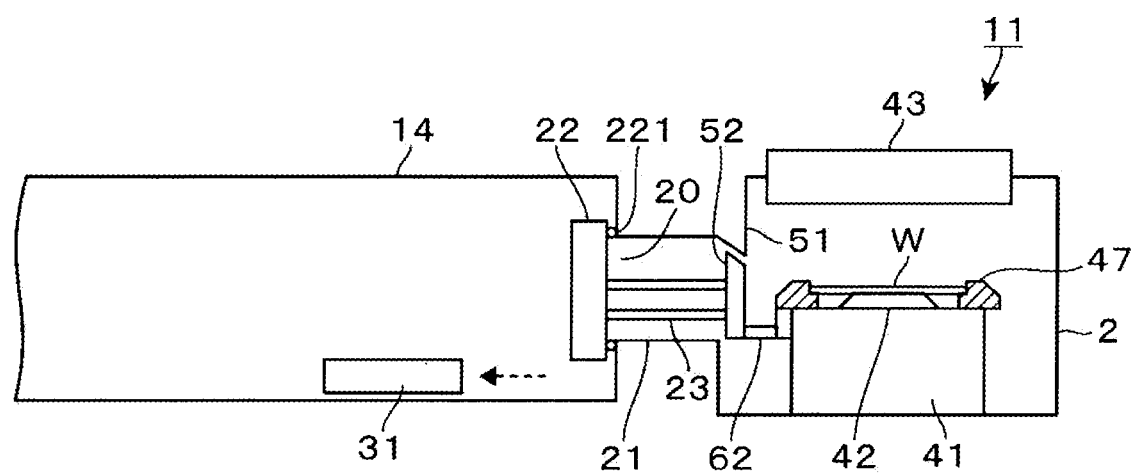
FIG. 6D is a fourth longitudinal cross-sectional view showing an action of the first embodiment.

Then, as shown in FIG. 6D, the opening 20 is closed by attaching the valve body 22 to the wall of the processing chamber 2 using the second screw mechanism 35. Thereafter, the moving body 31 is separated from the valve body 22 by driving the first screw mechanism 34. The moving body 31 separated from the valve body 22 is used to move another valve body 22.

In the substrate processing chamber 11 where the wafer W is loaded and the opening 20 is closed by the valve body 22, the wafer W is heated by a heater, if necessary, to a preset temperature. Further, an etching gas as a processing gas is supplied from the shower head 43 into the processing chamber 2. At the same time, an RF power is applied from the RF power supply 45. Accordingly, capacitively coupled plasma is produced in the processing chamber 2, and the wafer W is subjected to plasma etching by active species of the etching gas.

In this case, the focus ring 47, the second shield member 52, and the second flow rectifying member 62 are arranged at preset member arrangement positions. Accordingly, the etching that ensures excellent in-plane uniformity can be performed using the focus ring 47 while controlling the flow of the etching gas using the flow rectifying member 6, and the shield member 5 can prevent adhesion of by-products to the inner wall of the processing chamber 2.

After the plasma etching is completed, the moving body 31 is attached to the valve body 22. Next, the valve body 22 is separated from the wall of the processing chamber 2 by driving the second screw mechanism 35. Thereafter, the moving body 31 is raised and moved to unload the wafer W from the substrate processing chamber 11 in the reverse order of the loading operation. Here, in the case of performing another processing after the plasma etching, the wafer W is transferred to the substrate processing chamber 11 where another processing is performed. In the case of transferring the wafer W to another substrate processing chamber 11, the same loading operation as that in the example described with reference to FIGS. 6A to 6D is repeated.

During a period in which the valve body (first valve body) 22 is separated from the opening 20, the opening 20 is closed by the second valve body 26, as will be described later.

After the completion of all processes, the gate valve GV2 of the load-lock chamber 13 as a transfer destination is opened to transfer the wafer W to the load-lock chamber 13. Then, the valve body 22 is moved by the moving body 31 to load the processed wafer W into the load-lock chamber 13. Next, the opening 132 of the load-lock chamber 13 is closed by the valve body 22, and the wafer W is placed on the stage 130. The moving body 31 is separated from the valve body 22 and used for the moving operation of another valve body 22. Next, the inner atmosphere of the load-lock chamber 13 is adjusted to an atmospheric pressure atmosphere, and the gate valve GV1 is opened to transfer the wafer W to the atmospheric transfer mechanism 122 via the lift pins 131. After the wafer W is unloaded by the atmospheric transfer mechanism 122, the gate valve GV1 of the load-lock chamber 13 is closed, and the wafer W is accommodated in the carrier C.

<Maintenance and Cleaning of Members>

As described above, the valve body 22 of the present disclosure is provided with the focus ring 47, the second shield member 52, and the second flow rectifying member 62 via the member holding part 23. On the other hand, the members arranged in the substrate processing chamber 11 may be subject to maintenance or cleaning periodically. In this case, a target member may be separated from the substrate processing chamber 11 for maintenance or cleaning. Since the above-described members (the focus ring 47, the second shield member 52, and the second flow rectifying member 62) can be unloaded from the substrate processing chamber 11 using the moving body 31, they can be taken out without opening the substrate processing chamber 11 maintained in a vacuum atmosphere to the atmosphere.

For example, in the case of performing maintenance or the like, the moving body 31 is connected to the valve body 22 holding a target member, and the member held by the member holding part 23 is transferred to the load-lock chamber 13. Then, the opening 132 of the load-lock chamber 13 is closed by the valve body 22, and the inner atmosphere of the load-lock chamber 13 is returned to the atmospheric pressure atmosphere. Next, for example, the ceiling plate of the load-lock chamber 13 is opened, and an operator takes out at least one of the focus ring 47, the second shield member 52, and the second flow rectifying member 62. Then, these members are subjected to maintenance, cleaning, or replacement.

When the maintenance of the member is completed, the member is returned while being held by the member holding part 23. Next, the ceiling plate of the load-lock chamber 13 that has been opened is closed, and the transfer of the wafer W using the valve body 22 is resumed.

<Effect>

In accordance with the present embodiment, a member to be disposed in the substrate processing chamber 11 is connected to the valve body 22 via the member holding part 23. When the valve body 22 closes the opening 20 through which the substrate transfer chamber 14 and the substrate processing chamber 11 communicate, the member is transferred to a preset position in the substrate processing chamber 11. By integrating the valve body 22 that closes the opening 20 and the members to be disposed in the substrate processing chamber 11, these members can be unloaded from the substrate processing chamber 11 together with the valve body 22.

Since the valve body 22 can be moved by the moving body 31 disposed outside the substrate processing chamber 11, it is unnecessary to individually provide the transfer lift pins for arranging these members or the driving mechanism thereof in the substrate processing chamber 11. Therefore, the number of components arranged in the substrate processing chamber 11 can be reduced, which makes it possible to scale down the substrate processing chamber 11 or reduce the manufacturing cost.

In addition, by performing the opening/closing of the opening 20 using the valve body 22 and the transfer of the member at the same time, the number of steps is reduced compared to the case of performing those processes separately. Accordingly, the control of the driving mechanism in substrate processing can be simplified, or the operational cost can be reduced.

In the case of performing periodic maintenance or cleaning on a member disposed in the substrate processing chamber 11, the member is transferred to the load-lock chamber 13, and the opening 132 of the load-lock chamber 13 is closed by the valve body 22 to perform required processing. An operation such as maintenance or the like is performed in a state where the inner atmosphere of the load-lock chamber 13 is isolated from the substrate processing chamber 11, and the inner atmosphere of the substrate processing chamber 11 or the substrate transfer chamber 14 can be maintained in a vacuum atmosphere.

Therefore, in the case of performing maintenance or the like on the member, it is unnecessary to open the substrate processing chamber 11 or the substrate transfer chamber 14 maintained in the vacuum atmosphere to the atmosphere, which makes it possible to reduce the number of steps of the maintenance or the like, the processing time, and a period of time in which the substrate processing system is stopped.

Further, in a configuration in which members that require periodic maintenance or the like are transferred together with the valve body 22, the members are transferred as one unit, and the maintenance or the like of these members can be performed collectively. Therefore, the efforts and time required for maintenance or the like can be considerably reduced compared to the case of performing maintenance and the like of members individually. In addition, since the members are integrally formed with the member holding part 23, the assembly of the members and the operation check thereof can be performed collectively, which makes it possible to reduce the number of steps required for quality check in maintenance or the like.

Further, in the above-described embodiment, the valve body 22 and the moving body 31 are detachable. Accordingly, the moving body 31 can be separated from the valve body 22 that blocks the opening 20, and the moving body 31 can be shared by a plurality of valve bodies 22. Therefore, the number of moving bodies 31 may be smaller than that of the valve bodies 22, so that the number of components can be reduced. In addition, the area occupied by the moving bodies 31 can be reduced compared to the case where the moving bodies 31 are fixed to all the valve bodies 22, so that the substrate transfer chamber 14 can be scaled down.

On the other hand, it is unnecessary that the moving body 31 is separable from the valve body 22, and the moving body 31 may be fixed to all or a part of the valve body 22, if necessary.

<Configuration Example of Opening/Closing Mechanism for Opening>

Here, a configuration example of an opening/closing mechanism for an opening will be described with reference to FIG. 7. In the following description, like reference numerals as those of FIGS. 1 to 6D refer to like parts, and redundant description thereof will be omitted. In this configuration example, the second valve body 26 will be described.

Figure 7:
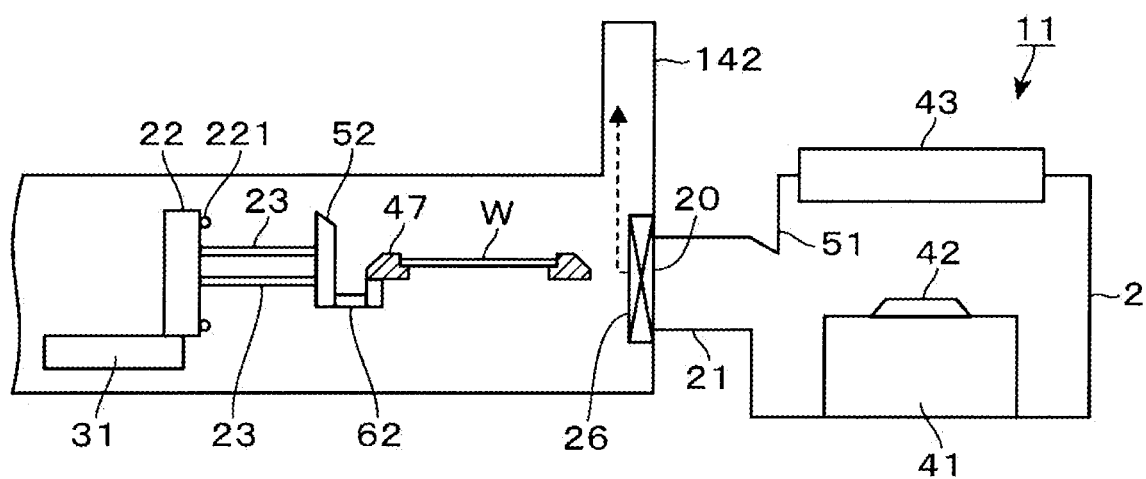
FIG. 7 is a longitudinal cross-sectional view showing a configuration example of an opening of a substrate processing chamber.

In the example shown in FIG. 7, the second valve body 26 is configured to be raised and lowered between a position at which the opening 20 is closed and a retract position located above the closing position. A valve box 142 corresponding to the retract position is formed at the substrate transfer chamber 14. However, the retract position of the second valve body 26 is not limited to the example shown in FIG. 7, and may be located below or on the side of the position at which the opening 20 is closed, for example.

When the wafer W is loaded into the substrate processing chamber 11, the opening 20 is closed by the valve body (first valve body) 22, and the wafer W is processed, as described in the first embodiment. Further, as shown in FIG. 7, when the wafer W is not processed and the member holding part 23 or the arrangement members are disposed on the substrate transfer chamber 14 side, the opening 20 is closed by the second valve body 26.

With this configuration, the opening 20 is closed by the second valve body 26 when the wafer W is disposed in the substrate transfer chamber 14. Therefore, it is possible to prevent reaction by-products generated in the substrate processing chamber 11 from flowing toward the substrate transfer chamber 14 during a period in which the valve body 22 is separated. In addition, a temperature condition or a pressure condition in the substrate processing chamber 11 is less likely to affect the substrate transfer chamber 14.

Second Embodiment

Figure 8A:
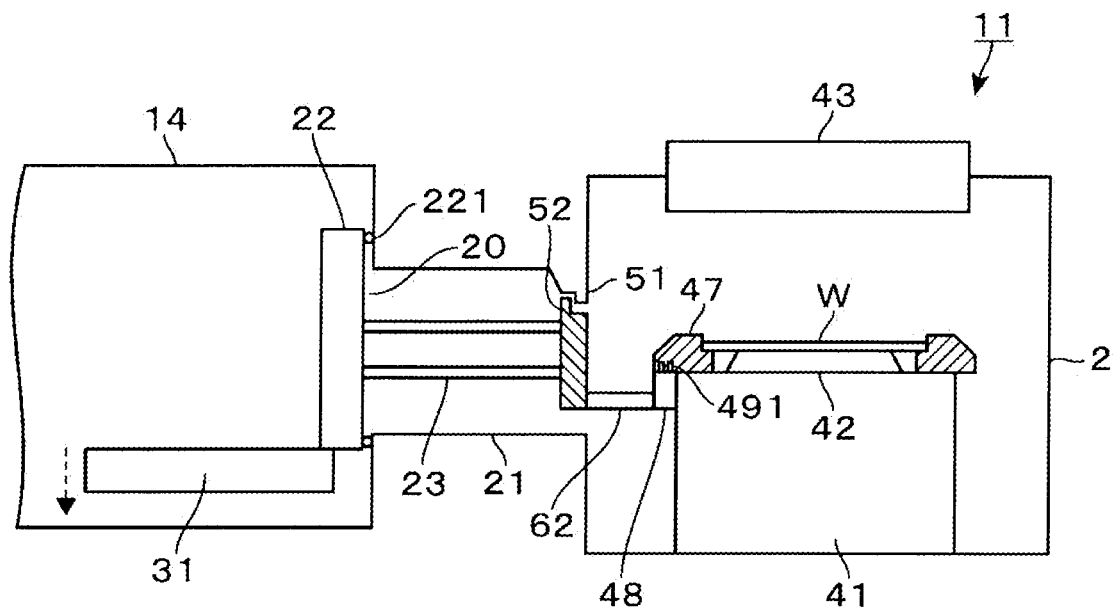
FIG. 8A is a first longitudinal cross-sectional view showing a substrate transfer chamber and a substrate processing chamber according to a second embodiment.
Figure 8B:
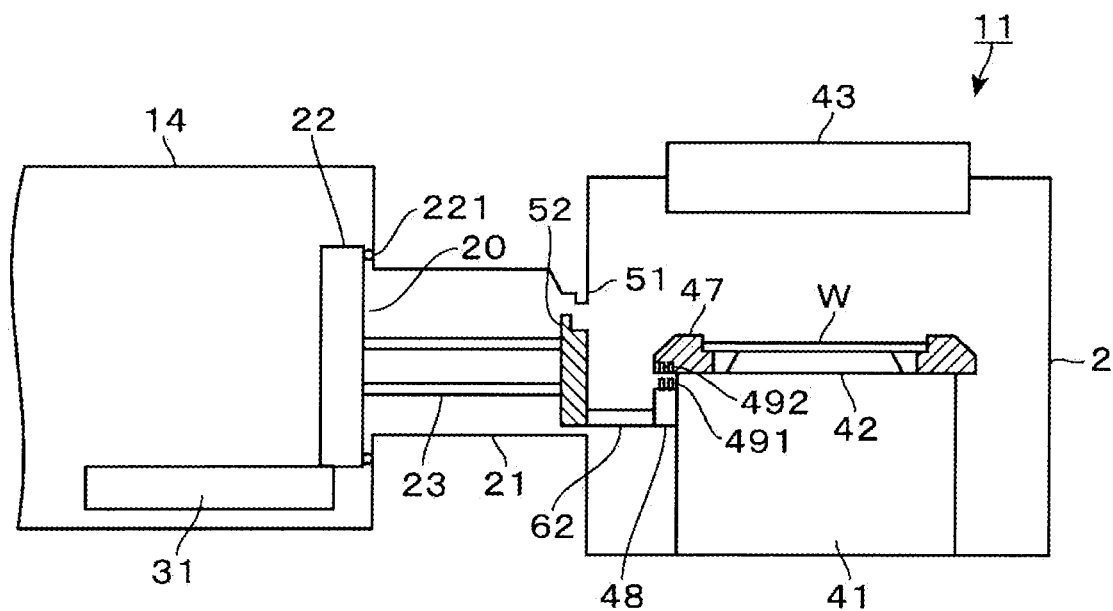
FIG. 8B is a second longitudinal cross-sectional view showing the second embodiment.

A second embodiment of the present disclosure will be described with reference to FIGS. 8A and 8B. In the present embodiment, the focus ring 47 and the support member 48 are separable each other. In the example of FIGS. 8A and 8B, connection pins 491 are disposed at the upper end of the support member 48, and recesses 492 having a shape corresponding to that of the connection pins 491 are formed in the bottom surface of the focus ring 47.

In this example, in order to transfer the arrangement member together with the valve body 22, the connection pins 491 are fitted into the recesses 492 by supporting the focus ring 47 from the bottom surface thereof using the support member 48. In a state where the focus ring 47 and the support member 48 are connected, the wafer W is transferred to the substrate support 41 in the same manner as that in the first embodiment, as shown in FIG. 8A. After the wafer W is placed on the substrate support 41, the moving body 31 is further lowered to extract the connection pins 491 of the support member 48 from the recesses 492 of the focus ring 47, thereby separating the focus ring 47 and the support member 48 (see FIG. 8B).

On the other hand, when the processing of the wafer W in the substrate processing chamber 11 is completed, the moving body 31 is raised again to insert the connection pins 491 of the support member 48 into the recesses 492 of the focus ring 47. Accordingly, the focus ring 47 and the wafer W are held by the member holding part 23. Thereafter, the wafer W is unloaded from the substrate processing chamber 11 to the substrate transfer chamber 14 in the same manner as that in the first embodiment. It is also possible to provide the connection pins on the focus ring 47 side and provide the recesses on the support member 48 side. This example is the same as the first embodiment except that that the focus ring 47 and the support member 48 are detachable.

The second embodiment can provide the same effects as those of the first embodiment. Since the focus ring 47 is separated from the valve body 22 during the processing of the wafer W, the position of the focus ring 47 does not change due to the change in the connecting position of the valve body 22. The valve body 22 is connected to the processing chamber 2 via an O-ring 221, and the position where the valve body 22 closes the opening 20 changes slightly due to the shape change caused by deterioration of the O-ring 221 or the like, which may affect the arrangement of the focus ring 47. Therefore, the improvement of the accuracy of the arrangement position of the focus ring 47 may be expected by employing the configuration in which the focus ring 47 is separated from the valve body 22 during the processing of the wafer W as in this example.

Third Embodiment

A third embodiment of the present disclosure will be described with reference to FIG. 9. The present embodiment describes another example of the arrangement member disposed in the substrate processing chamber. In this embodiment, the arrangement member is a shutter that covers non-target surfaces of pre-coating in the case of performing pre-coating of the substrate processing chamber. The non-target surfaces are surfaces on which pre-coating is not performed in the substrate processing chamber.

Figure 9:
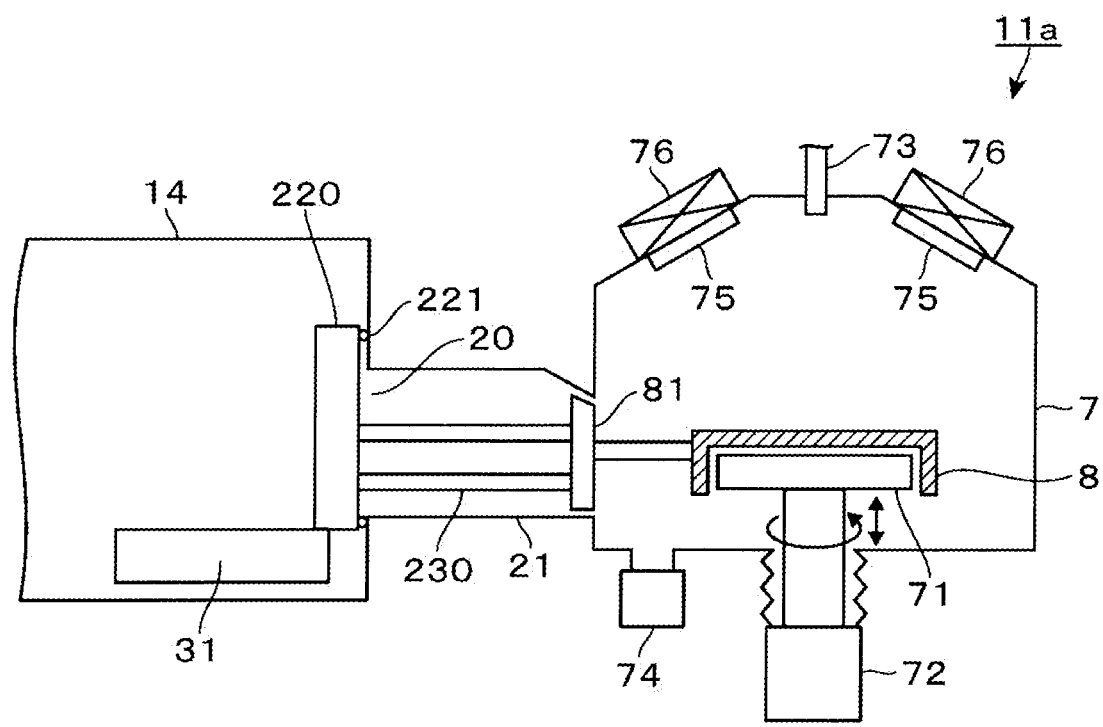
FIG. 9 is a longitudinal cross-sectional view showing a substrate transfer chamber and a substrate processing chamber according to a third embodiment.

The substrate processing chamber shown in FIG. 9 is configured to perform film formation on a wafer W by physical vapor deposition (PVD), for example. An example in which the arrangement member is a shutter used for pre-coating will be described with reference to FIG. 9.

First, the film formation will be briefly described. A substrate processing chamber 11a includes a processing chamber 7 communicating with the substrate transfer chamber 14 through the opening 20. In this example, the valve body 22 to which the member holding part 23 capable of transferring a wafer W, and a valve body 220 to which a member holding part 230 for holding the shutter 8 that is the arrangement member are provided as the substrate holding part.

The substrate processing chamber 11a is the same as the substrate processing chamber 11 described with reference to FIGS. 6A to 6D in that the valve body 22 is moved by moving the moving body 31 so that the wafer W is transferred by the member holding part 23 and subjected to processing.

After the wafer W is loaded into the processing chamber 7, a gas is supplied from a gas supply port 73 and the processing chamber 7 is depressurized by an exhaust mechanism 74. On the other hand, a voltage is applied to targets 75 disposed in the processing chamber 7 via holders and, at the same time, cathode magnets 76 disposed outside the processing chamber 7 to face the targets 75 are driven. Accordingly, plasma is concentrated near the targets 75 and positive ions in the plasma collide with the targets 75. Accordingly, the constituent materials of the targets 75 are released and deposited on the wafer W, thereby forming a film on the wafer W.

In the substrate processing chamber 11a described above, before film formation is performed, the shutter 8 is disposed and pre-coating is performed in the processing chamber 7. As shown in FIG. 9, the shutter 8 is formed to cover the upper surface and side surface of the substrate support 71 when it is transferred to a preset arrangement position.

The valve body 220 and the member support part 230 have the same configuration as those of valve body 22 and the member support part 23 described with reference to FIGS. 1 to 6D, respectively. In other words, when the opening 20 is closed by the valve body 220, the member holding part 230 is disposed to extend into the substrate processing chamber 11a, and the shutter 8 is transferred to the member arrangement position. Further, in the example of FIG. 9, a shutter member 81 is provided, as the arrangement member, at the member holding part 23, and is configured to partially or completely block the opening 70 between the processing chamber 7 and the communication path 21.

In the case of performing pre-coating, the opening 20 is closed by the valve body 220, the shutter 8 is transferred to the member arrangement position to cover the upper surface and side surface of the substrate support 71 that are the non-target surfaces of the pre-coating. Then, the processing chamber 7 is exhausted by the exhaust mechanism 74, for example. A pre-coating gas is supplied from the gas supply port 73, and an RF power, for example, is applied to the pre-coating gas from a plasma generator (not shown). Accordingly, plasma is produced from the pre-coating gas, and the pre-coating for forming a pre-coating film in the processing chamber 7 is performed.

The pre-coating film is formed on all the surfaces in the processing chamber 7 except the non-target surfaces covered by the shutter 8. Due to the pre-coating, the member can be protected from plasma used for sputtering.

After the pre-coating is performed, the supply of the pre-coating gas and the generation of plasma are stopped, for example. At the same time, the supply of an inert gas is started to replace the inner atmosphere of the processing chamber 7 with the inert gas. Then, the valve body 220 is separated from the opening 20, and the opening 20 is opened to unload the shutter 8 from the substrate processing chamber 11a.

Further, in the case of performing gas cleaning or plasma cleaning in the substrate processing chamber, the member disposed in the substrate processing chamber may be a shutter that covers the non-target surfaces of the cleaning process. When it is configured to form a film on the wafer W in the substrate processing chamber, the cleaning process is performed after the film formation is performed a preset number of times, for example. For example, the shutter for the cleaning process has the same configuration as that of the shutter 8 for the pre-coating described with reference to FIG. 9. In this configuration, when the opening is closed by the valve body, and the shutter is transferred to a preset arrangement position, the shutter covers the upper surface and side surface of the substrate support, which are the non-target surfaces of the cleaning process.

In the case of performing the cleaning process, the opening is closed by the valve body, and the shutter is transferred to the member placement position to cover the upper surface and side surface of the substrate support. Then, a cleaning gas is supplied, and plasma is produced, if necessary, to perform cleaning of the processing chamber. Since the upper surface and side surface of the substrate support are covered by the shutter during the cleaning process, they are protected from the cleaning gas or the plasma, and the damage thereto is suppressed.

The arrangement member may include at least one member selected from the member group consisting of the wafer, the focus ring, the shield member, the flow rectifying member, and the shutter. Therefore, only the wafer may be transferred by the member holding part (the substrate holding part) together with the valve body. In addition to the above member group, the arrangement member may include a member that is disposed in the substrate processing chamber and transferred to a preset arrangement position in the substrate processing by the member holding part extending from the valve body when the opening is closed by the valve body. Further, the shape of the member holding part is not limited to the above example, and may be a shape that allows the member holding part to extend from the valve body into the substrate processing chamber when the opening is closed by the valve body and allows the member to be transferred to the member arrangement position.

Further, the moving mechanism is not limited to the magnetic levitation type moving mechanism described above, and may be configured to transfer the valve body and the member held by the member holding part to the load-lock chamber via the position where the opening is closed by the valve body and the substrate transfer chamber. Therefore, the moving body to which the valve body is attached may move on a rail, or the moving body may be provided with wheels. Further, the valve body and the member held by the member holding part may be moved by a transfer mechanism having a multi-joint arm. Moreover, the valve body may be fixed to the moving body without being attached thereto and detected therefrom.

Further, the substrate processing chamber and the substrate transfer chamber are not limited to the above embodiment as long as they are adjacent to each other. Although the communication path is disposed between the substrate processing chamber and the substrate transfer chamber in the above-described embodiments, the length (dimension in the Y' direction in FIG. 3) of the communication path may be appropriately set, and the communication path may be substantially not provided.

The configuration of the substrate support is not limited to the above example. The wafer may be transferred to and placed on the substrate support by the transfer lift pins without providing the above-described convex portion for placing a wafer.

The embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall in the scope and spirit of the disclosures.

What is claimed is:

1. An apparatus for transferring a member to be disposed in a substrate processing chamber between a substrate transfer chamber and the substrate processing chamber adjacent to each other, comprising:
   a valve body that is attached to and detached from an opening through which the substrate transfer chamber and the substrate processing chamber communicate and is configured to close the opening;
   a member holding part extending from the valve body into the substrate processing chamber when the opening is closed by the valve body, and configured to transfer the member to a preset arrangement position in the substrate processing chamber; and
   a moving mechanism configured to move the valve body separated from the opening in the substrate transfer chamber,
   wherein the moving mechanism includes:
   a floor of the substrate transfer chamber that is provided with a first magnet; and
   a moving body to which the valve body is attached, provided with a second magnet having a repulsive force against the first magnet, and configured to be movable in the substrate transfer chamber by magnetic levitation using the repulsive force, and
   wherein the moving body is configured to be attached to and detached from the valve body, and is separated from the valve body that closes the opening.

2. The apparatus of claim 1, wherein the member includes a substrate to be processed in the substrate processing chamber, and
   the member holding part is configured to hold the substrate and serves as a substrate holding part configured to transfer the substrate to a position where processing is performed.

3. The apparatus of claim 1, wherein the member includes at least one member selected from a member group consisting of a focus ring disposed around the substrate when plasma processing is performed on the substrate, a shield member configured to prevent by-products generated by the processing of the substrate from being adhered to a main body of the substrate processing chamber, a flow rectifying member configured to rectify air flow in the substrate processing chamber, and a shutter that covers non-target surfaces of pre-coating or cleaning in the case of performing the pre-coating or the cleaning in the substrate processing chamber.

4. The apparatus of claim 1, wherein the valve body moved by the moving mechanism in the substrate transfer chamber is a first valve body, and
   the apparatus further comprises a second valve body that blocks the opening during a period in which the first valve body is separated from the opening.

5. A system for processing a substrate, comprising:
   the substrate transfer chamber, the substrate processing chamber, and the device for transferring the member that are described in claim 1.

6. A method for transferring a member to be disposed in a substrate processing chamber between a substrate transfer chamber and the substrate processing chamber adjacent to each other, the method using a valve body that is attached to and detached from an opening through which the substrate transfer chamber and the substrate processing chamber communicate and is configured to close the opening, a member holding part that is disposed at the valve body to extend from the valve body into the substrate processing chamber when the opening is closed by the valve body, and a moving mechanism configured to move the valve body in the substrate transfer chamber, the moving mechanism including: a floor of the substrate transfer chamber that is provided with a first magnet; and a moving body to which the valve body is attached, provided with a second magnet having a repulsive force against the first magnet, and configured to be movable in the substrate transfer chamber by magnetic levitation using the repulsive force, and the moving body being configured to be attached to and detached from the valve body, and being separated from the valve body that closes the opening, the method comprising:
   closing the opening by the valve body and transferring the member to a preset arrangement position in the substrate processing chamber; and
   separating the valve body from the opening and moving the valve body in the substrate transfer chamber.

* * * * *